United States Patent
Ramsay

(10) Patent No.: US 9,470,595 B2
(45) Date of Patent: Oct. 18, 2016

(54) APPARATUS FOR DRY SIDE MOUNTING A CRASH PRESSURE SENSOR

(71) Applicant: Mark W. Ramsay, Livonia, MI (US)

(72) Inventor: Mark W. Ramsay, Livonia, MI (US)

(73) Assignee: TRW Automotive U.S. LLC, Farmington Hills, MI (US)

( * ) Notice: Subject to any disclaimer, the term of this patent is extended or adjusted under 35 U.S.C. 154(b) by 0 days.

(21) Appl. No.: 14/473,044

(22) Filed: Aug. 29, 2014

(65) Prior Publication Data

US 2016/0061682 A1 Mar. 3, 2016

(51) Int. Cl.
| | | |
|---|---|---|
| *B60R 21/0136* | (2006.01) | |
| *G01L 19/00* | (2006.01) | |
| *G01L 19/14* | (2006.01) | |
| *H05K 5/00* | (2006.01) | |
| *B60R 21/01* | (2006.01) | |

(52) U.S. Cl.
CPC ....... *G01L 19/0069* (2013.01); *B60R 21/0136* (2013.01); *G01L 19/147* (2013.01); *H05K 5/0078* (2013.01); *B60R 2021/01006* (2013.01)

(58) Field of Classification Search
CPC . B60R 21/0136; B60R 21/013; B60R 21/01; B60R 21/00; B60R 2021/01006; B60R 2021/0006; B60R 2021/0002; B60R 2011/0021; B60R 2011/0019; B60R 2011/0003; B60R 2011/0001; B60R 11/00; B29C 45/14655; G01D 11/245; G01D 11/24; G01D 11/305; G01D 11/30; H05K 5/0078
USPC .................. 180/274; 280/735, 734; 340/436; 701/45
See application file for complete search history.

(56) References Cited

U.S. PATENT DOCUMENTS

| | | | |
|---|---|---|---|
| 5,714,409 A | 2/1998 | Parsons | |
| 5,763,787 A | 6/1998 | Gravel et al. | |
| 5,773,720 A | 6/1998 | Miyata | |
| 5,804,783 A | 9/1998 | Breed | |
| 5,828,290 A | 10/1998 | Buss et al. | |
| 5,873,597 A | 2/1999 | Sim | |
| 5,945,606 A * | 8/1999 | Tokunaga et al. ............. | 73/756 |
| 5,950,973 A | 9/1999 | Verma | |
| 6,298,730 B1 | 10/2001 | Yamagishi et al. | |
| 6,377,445 B1 | 4/2002 | Davis et al. | |
| 6,435,017 B1 | 8/2002 | Nowicki, Jr. et al. | |
| 6,736,355 B2 | 5/2004 | Palfenier et al. | |
| 6,948,375 B2 * | 9/2005 | Nomura ........................ | 73/756 |
| 7,042,212 B2 | 5/2006 | Yoshikawa et al. | |

(Continued)

OTHER PUBLICATIONS

U.S. Murray et al. U.S. Appl. No. 14/203,999, filed Mar. 11, 2014 for Apparatus for Snap Mounting a Crash Sensor.

(Continued)

*Primary Examiner* — Keith Frisby
(74) *Attorney, Agent, or Firm* — Tarolli, Sundheim, Covell & Tummino LLP

(57) ABSTRACT

A crash pressure sensor assembly includes a housing and an inlet arm extending from the housing, the inlet arm having a through bore. The housing is secured to a dividing panel so that a main portion of the housing is located on a first side of the dividing panel and the inlet arm extends through to a second side of the dividing panel. A pressure sensor is located in the housing so as to be on the first side of the dividing panel. The pressure sensor senses air pressure on the second side of the dividing panel via the through bore of the inlet arm and provides an electrical signal indicative of the sensed pressure. An electrical connector provides an electrical connection to the pressure sensor within the housing.

11 Claims, 5 Drawing Sheets

(56) References Cited

U.S. PATENT DOCUMENTS

| | | |
|---|---|---|
| 7,116,215 B2 | 10/2006 | Oonishi |
| 7,137,472 B2 | 11/2006 | Aoki |
| 7,208,943 B2 | 4/2007 | Godoy et al. |
| 7,277,022 B2 | 10/2007 | Christoph et al. |
| 7,380,458 B1 * | 6/2008 | Date .................... G01D 11/245 180/274 |
| 7,502,677 B2 | 3/2009 | Weichenberger et al. |
| 7,526,963 B2 | 5/2009 | Wanami et al. |
| 7,806,222 B2 | 10/2010 | Takahashi et al. |
| 7,841,240 B2 | 11/2010 | Kurtz et al. |
| 7,845,677 B2 | 12/2010 | Franke |
| 7,911,331 B2 | 3/2011 | Tanabe |
| 8,074,523 B2 | 12/2011 | Henzler et al. |
| 8,142,073 B2 | 3/2012 | Clark |
| 8,210,037 B2 | 7/2012 | Christoph et al. |
| 8,387,457 B2 | 3/2013 | Snider et al. |
| 8,396,631 B2 | 3/2013 | Buyukbas et al. |
| 8,468,895 B2 | 6/2013 | Colombo et al. |
| 8,505,386 B2 | 8/2013 | Colombo et al. |
| 8,581,116 B2 | 11/2013 | Ludwig |
| 8,619,429 B2 | 12/2013 | Moser et al. |
| 8,621,925 B2 * | 1/2014 | Dietrich et al. ................ 73/431 |
| 8,707,783 B2 | 4/2014 | Ludwig |
| 8,763,670 B2 | 7/2014 | Clouse et al. |
| 8,966,975 B2 | 3/2015 | Campbell et al. |
| 9,003,891 B2 | 4/2015 | Frank |
| 2002/0069700 A1 * | 6/2002 | Dirmeyer et al. .............. 73/431 |
| 2004/0211875 A1 | 10/2004 | Wisniewski et al. |
| 2007/0267941 A1 | 11/2007 | Eidel et al. |
| 2009/0198418 A1 | 8/2009 | Itoga |
| 2009/0300893 A1 | 12/2009 | Herrmann et al. |
| 2010/0308192 A1 | 12/2010 | Spratte et al. |
| 2011/0107835 A1 | 5/2011 | Campbell et al. |
| 2011/0265577 A1 | 11/2011 | Kunert |
| 2012/0237402 A1 | 9/2012 | Cantarelli et al. |
| 2012/0247179 A1 | 10/2012 | Kerin et al. |
| 2013/0333941 A1 | 12/2013 | Snider |
| 2014/0047913 A1 | 2/2014 | Waite et al. |
| 2014/0137656 A1 | 5/2014 | Henzler et al. |

OTHER PUBLICATIONS

U.S. Murray et al. U.S. Appl. No. 4/217,874, filed Mar. 18, 2014 for Circuit Mounting Apparatus and Method Using a Segmented Lead-Frame.

U.S. Murray, Jr., et al. U.S. Appl. No. 14/203,999, filed Mar. 11, 2014.

PCT/US2015/043423 International Search Report and Written Opinion, completed Sep. 30, 2015.

* cited by examiner

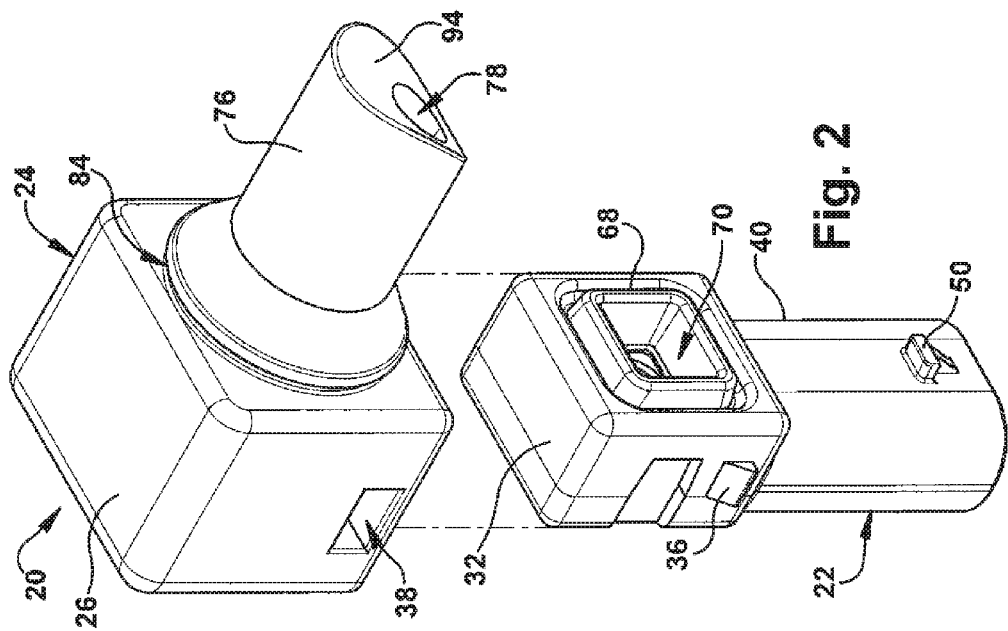
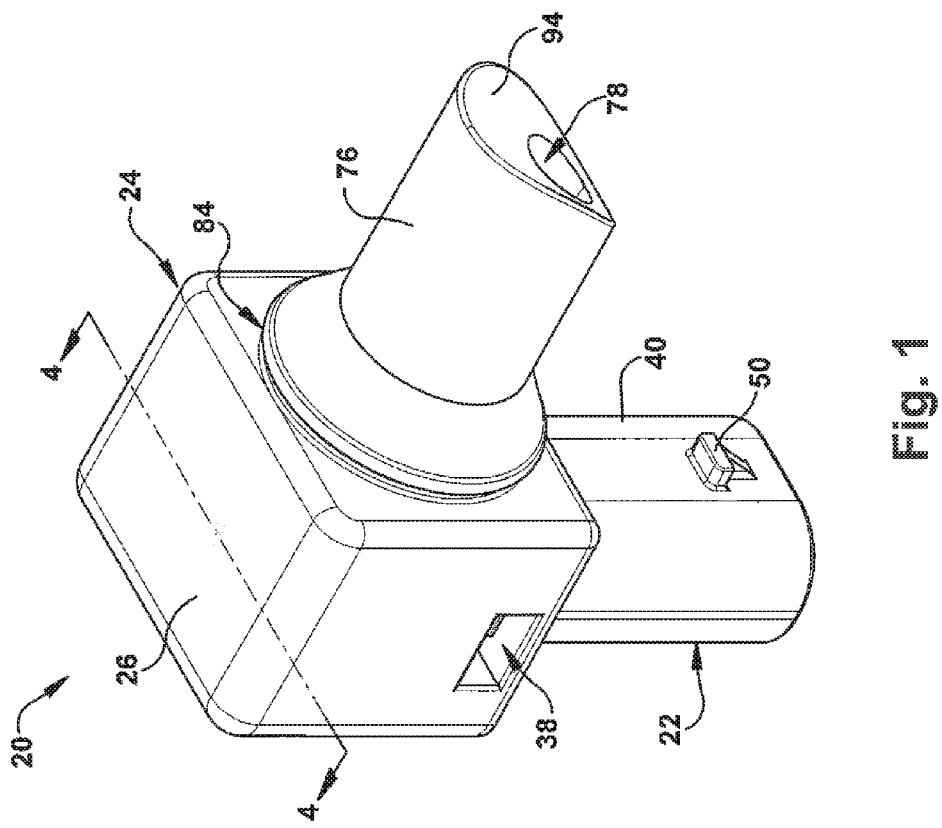

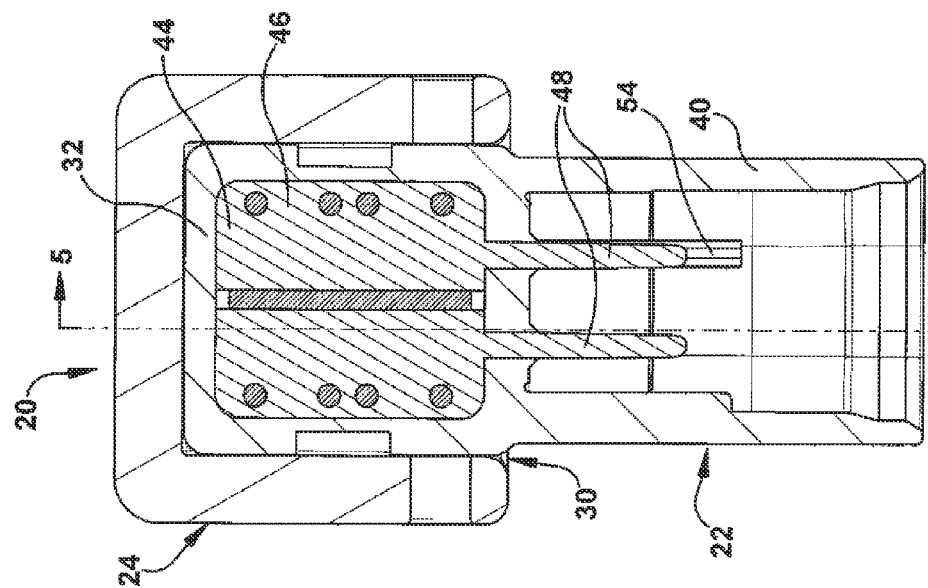
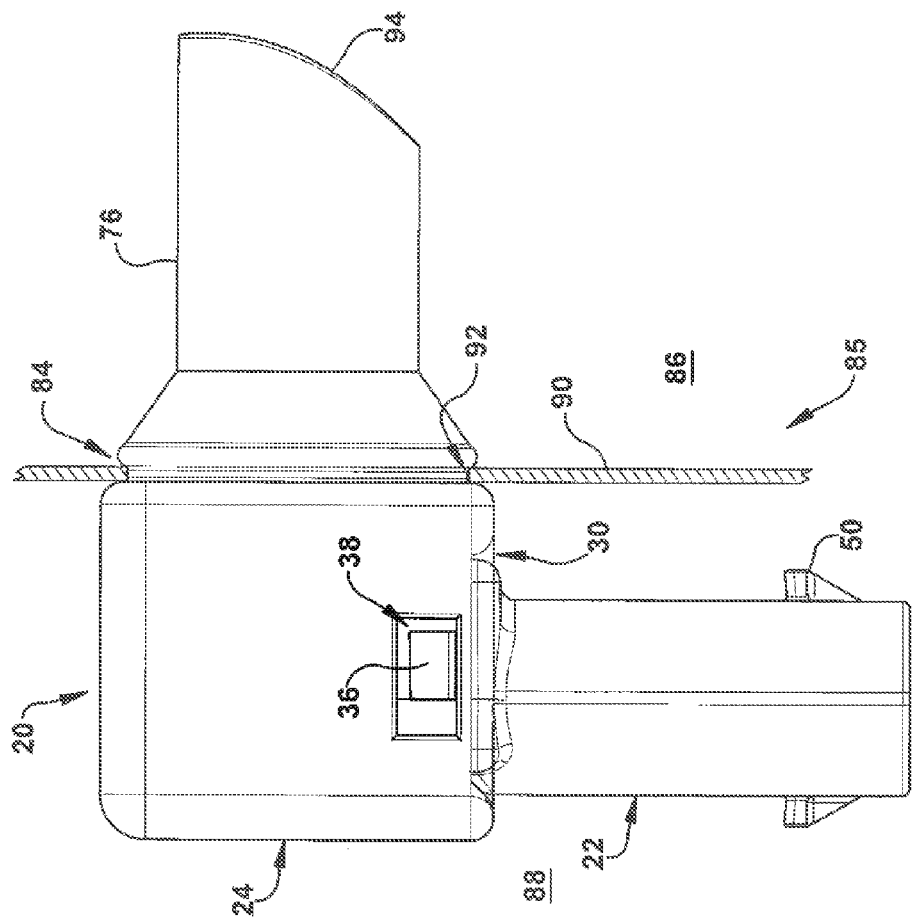

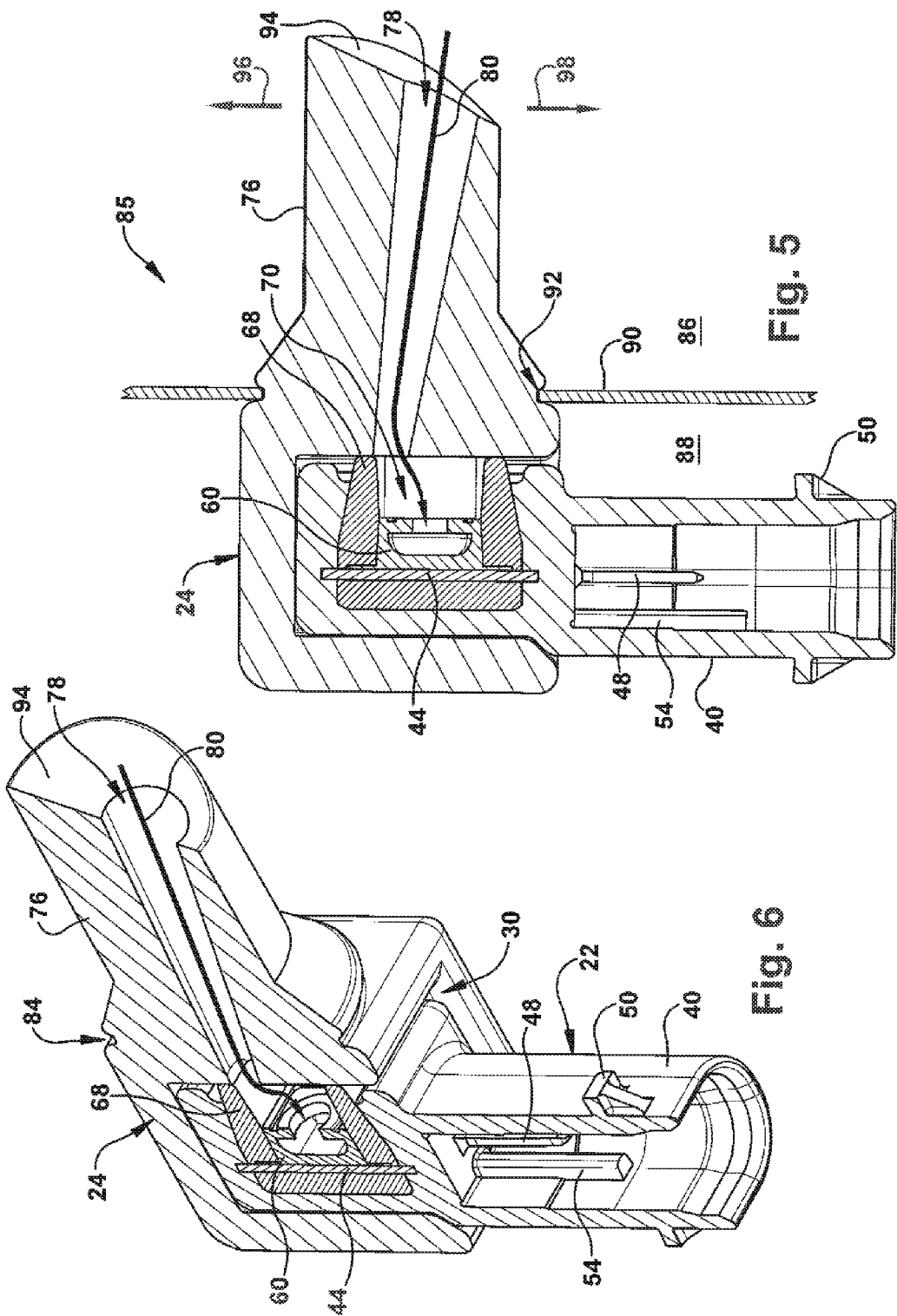

APPARATUS FOR DRY SIDE MOUNTING A CRASH PRESSURE SENSOR

FIELD OF THE INVENTION

The present invention is directed to vehicle crash sensors and is more particularly direct to an apparatus for dry side mounting a crash pressure sensor in a vehicle door.

BACKGROUND OF THE INVENTION

Actuatable vehicle occupant protection systems are known in the art. Such protection systems may include one or more vehicle crash sensors for detecting the occurrence of a vehicle crash condition. When a vehicle crash condition is detected by the crash sensor, the protection system may actuate an inflatable device, such as an air bag, for helping to protect an occupant of the vehicle.

Certain types of vehicle crash sensors may include mechanical devices, such as switches, that close in response to deformation of the vehicle or a sudden deceleration of the vehicle. The closure of the mechanical device indicates the occurrence of a vehicle crash condition. Other vehicle crash sensors may include electrical devices, such as an accelerometer, for detection of a crash condition. When a processed output of the electrical crash sensor device, for example, a voltage level crosses a threshold value, a vehicle crash condition is determined to be occurring, and the actuatable restraining device is actuated.

Vehicle crash sensors for detecting a side impact to a vehicle must have particularly rapid response times as the time period for actuating an inflatable device for occupant protection during a side impact event is significantly less than the time period needed for actuating an inflatable device for occupant protection during a frontal impact event. To help improve the response time of a vehicle crash sensor for sensing side impacts, it is common to locate the vehicle crash sensor at a side location of the vehicle, such as within a side door of the vehicle. Such side impact crash sensor arrangements may include accelerometers and/or pressure sensors that respectively monitor for changes in the vehicle's sideways acceleration and changes in pressure within a vehicle door as would occur upon crushing of the vehicle door. The vehicle side crash event may be determined in response to both the side acceleration and pressure change signals.

SUMMARY OF THE INVENTION

In accordance with one embodiment of the present invention, a crash pressure sensor assembly is provided comprising a housing and an inlet arm extending from the housing, the inlet arm having a through bore. The housing is secured to a dividing panel so that a main portion of the housing is located on a first side of the dividing panel and the inlet arm extends through to a second side of the dividing panel. A pressure sensor is located in the housing so as to be on the first side of the dividing panel. The pressure sensor senses air pressure on the second side of the dividing panel via the through bore of the inlet arm and provides an electrical signal indicative of the sensed pressure. An electrical connector provides an electrical connection to the pressure sensor within the housing.

In accordance with another embodiment of the present invention, a crash pressure sensor is provided comprising a housing having a receiving portion and an inlet arm extending from the housing, the inlet arm having a through bore extending from a distal end of the inlet art to the receiving portion. A securing means secures the housing to a dividing panel so that the receiving portion of the housing is located on a first side of the dividing panel and the inlet arm extends through to a second side of the dividing panel. A base sensor unit is provided and dimensioned to be received in the receiving portion of the housing. A pressure sensor is located in the base sensor unit for sensing air pressure on the second side of the dividing panel via the through bore of the inlet arm and provides an electrical signal indicative of the sensed pressure. The base sensor unit includes an electrical connector for providing an electrical connection to said pressure sensor.

BRIEF DESCRIPTION OF THE DRAWINGS

The foregoing and other features and advantages of the present invention will become apparent to those skilled in the art to which the present invention relates upon reading the following description with reference to the accompanying drawings, in which:

FIG. 1 is a schematic perspective view of a crash pressure sensor assembly made in accordance with one example embodiment of the present invention;

FIG. 2 is an exploded view of the crash pressure sensor assembly of FIG. 1;

FIG. 3 is side view of the crash pressure sensor assembly of FIG. 1 mounted to an interior door dividing panel;

FIG. 4 is a cross-sectional view of the crash pressure sensor assembly of FIG. 1 taken along line 4-4;

FIG. 5 is a cross-sectional view of the crash pressure sensor assembly of FIG. 1 taken along line 5-5 of FIG. 4 and shown as being mounted to an interior door dividing panel;

FIG. 6 is a perspective cross-sectional view of the crash pressure sensor assembly shown in FIG. 5;

DETAILED DESCRIPTION

Figure 7:
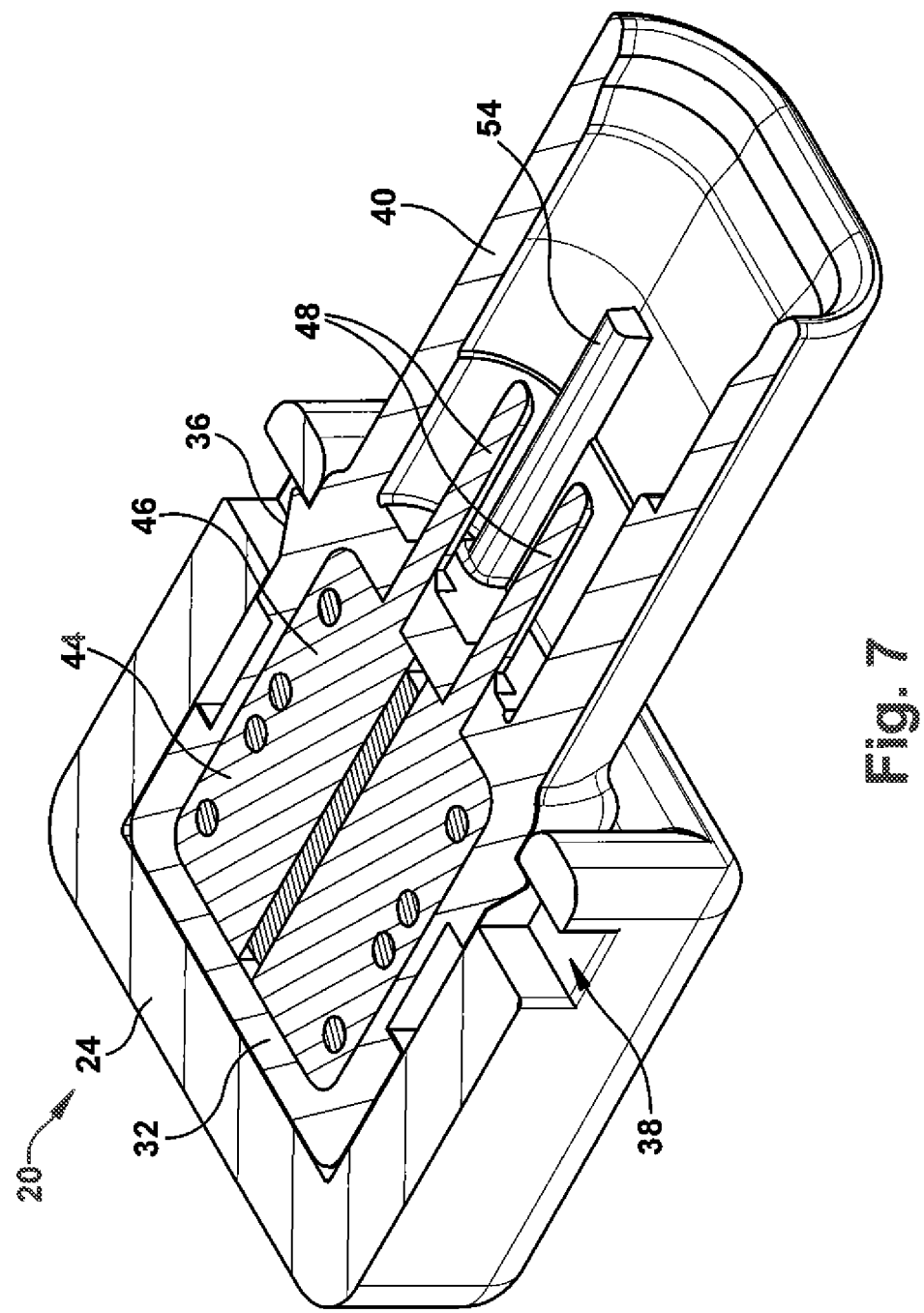
FIG. 7 is a perspective cross-sectional view of the crash pressure sensor assembly of FIG. 1 similar to the plan cross-sectional view of FIG. 4.
Figure 9:
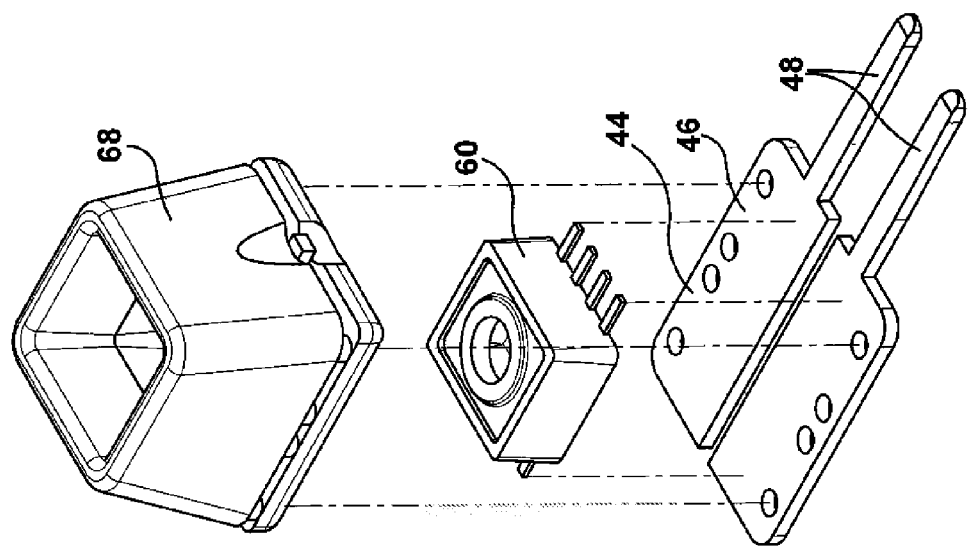
FIG. 9 is an exploded view of the pressure sensor shown in FIG. 8.
Figure 8:
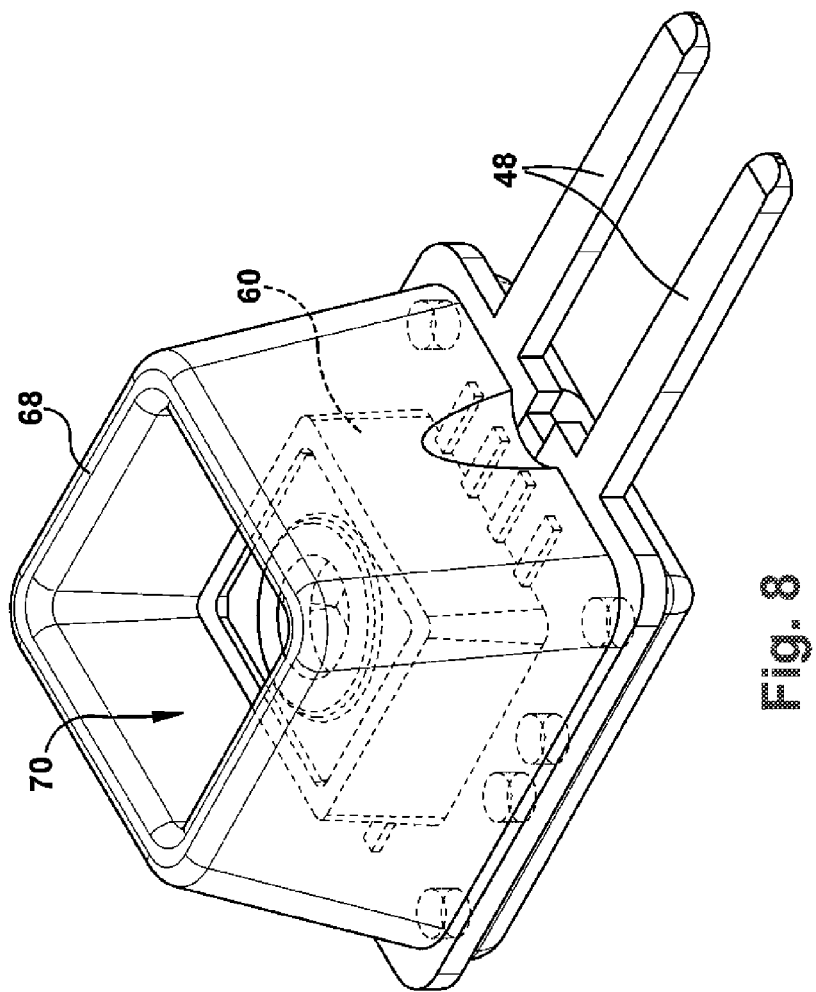
FIG. 8 is a perspective view of a portion of the crash pressure sensor assembly of FIG. 1 showing the pressure sensor in greater detail.

Referring to the Figs., a crash pressure sensor assembly 20, made in accordance with one example embodiment of the present invention, is schematically shown. This crash pressure sensor assembly 20 could be use as part of an actuatable restraint system in a vehicle. The crash pressure sensor assembly 20 includes a base sensor unit 22 and an inlet housing portion 24. The inlet housing portion 24 includes a main body or receiving portion 26. Both the base sensor unit 22 and the inlet housing portion 24 can be made from a plastic material using, for example, a molding process.

The main body or receiving portion 26 of the inlet housing portion 24 has an opening 30 that is dimensioned to slidably receive a sensor housing portion 32 of the base sensor unit 22. The sensor housing portion 32 of the base sensor unit 22 includes oppositely located tapered locking tabs 36 that are received in associated locking tab openings 38 in the main body or receiving portion 26 of the inlet housing portion 24. Once the sensor housing portion 32 of the base sensor unit 22 is slid into the opening 30, the locking tabs 36 lock into the openings 38 which, in turn, hold the base sensor unit 22 and the inlet housing portion 24 together.

The base sensor unit 22 further includes a connector shroud 40 that extends from the sensor housing portion 32 and is preferably integrally formed therewith. A slotted lead frame 44 is secured within the sensor housing portion 32 during the molding process of the sensor housing portion 32. The slotted lead frame 44 functions as a sensor mounting substrate and includes a main body portion 46 and connector pins 48 that extend into the connector shroud 40. The design and function of the slotted lead frame 44 is fully described in copending U.S. patent application Ser. No. 14/217,874 filed Mar. 18, 2014 to Murray et al. and assigned to the assignee of the present application and is hereby fully incorporated herein by reference.

An external connector (not shown) can be plugged into connector shroud 40 so as to provide an electrically connection to the connector pins 48 and, thereby, an electrical connection to any circuitry mounted on the lead frame 44. The shroud 40 includes locking tabs 50 located on opposite sides of the shroud so as to retain mechanical connection between the external electrical connector and the pressure sensor assembly 20. A key device 54 is located within the shroud 40 that is used with an external connector to insure that the external connector is plugged into the shroud in the correct orientation. The external connector would have a commensurate slot dimensioned to receive the shroud key 54 so as to ensure proper orientation of the external connector and the pressure sensor assembly 20.

The base sensor unit 22 further includes a pressure sensor 60 mounted on the lead frame 40 for sensing any pressure applied against the sensor and providing an electrical signal indicative thereof. An elastomeric seal member 68 surrounds the lead frame 44 and extends outward from an opening 70 in the base sensor unit 22. The extending portion of the elastomeric seal member 68 insures a waterproof seal between the housing member 24 and the base sensor unit 22 after the two parts are assembled together.

The housing member 24 includes an arm portion 76 that extends from the main body or receiving portion 26 and includes a through bore 78 that permits fluid flow communication of an area outside the end of the arm 76 to the pressure sensor 60 of the base sensor unit 22. The airflow path is shown as arrow 80 in the Figs. The housing member 24 further includes a door panel receiving grove 84 that is, in accordance with one example embodiment, circular in shape.

The crash pressure sensor assembly 20 is designed to fit within an interior area 85 of a vehicle door. The inside area within the vehicle door is divided into two separate areas including an area referred to as the wet-side 86 and an area referred to as the dry-side 88. A door panel 90 is located within the interior of the vehicle door to separate the dry-side area from the wet-side area. As the names imply, the wet-side area 86 of the door may be subject to environmental conditions that allow moisture e.g., rain, to be present in that side of the door. The dry-side area 88 of the door is sealed off from the environmental conditions so as to remain mainly dry. The crash pressure sensor assembly 20 is snap-fit into a circular opening 92 with the door panel receiving groove 84 receiving the door panel 90 so that the arm portion 76 extends into the wet-side 86 of the door and the base sensor unit 22 is on the dry-side 88 of the door. The door panel receiving groove 84 and the opening 92 are dimensioned so that once the sensor assembly 20 is snap-fit into the door panel, the door panel retains the sensor assembly 20 in position. The combination of the groove 84 and the snap-fit arrangement aids in providing a water-tight seal to maintain a wet side/dry side divide within the vehicle door. Also, the distal end 94 of the arm portion 76 is angled and shaped to enhance water runoff and help prevent water from entering the end opening 78 of the arm portion 76. Also, the inside of the through bore 78 is sloped downward away from the pressure sensor 60 so that water entering the open end would have to run uphill to reach the pressure sensor, i.e., water in the through bore 78 would run away from the pressure sensor. The arrow 96 in FIG. 5 is pointing toward the top of the vehicle door and the arrow 98 is pointing toward the bottom of the vehicle door so that it can be better understood that the through bore 78 is sloped so as to run downhill away from the pressure sensor 60. When assembled, the connector shroud 40 and connector pins 48 face downward toward the bottom of the vehicle door.

During a crash event into the vehicle door, the pressure sensor 60 measures any change in air pressure such as would occur within a vehicle door panel during a side impact crash event of the vehicle. During a crash event, crushing of the vehicle door will result in a decrease interior volume within the door panel which raises the air pressure within the door. An electronic control unit (not shown) would be connected to the sensor 60 via the connector pins 48 and associated connector and make a crash determination based on the sensor outputs.

As can be seen from FIG. 5, the crash pressure sensor 20 has its inlet port 78 on the wet-side 86 of the vehicle door and the sensor and connector portions located on the dry-side 88 of the vehicle door. As mentioned, any moisture entering the door from above the sensor should not enter the sensor 60 in that it should run off the sloped surface 94 at the end arm 76 and any water that does enter the opening of the through bore 78 should not run uphill into the through bore. It should also be noted that the connector shroud 40 is located on the dry-side 88 of the door and has its opening facing downward toward the bottom of the door.

From the above description of the invention, those skilled in the art will perceive improvements, changes and modifications. For example, the present invention has been described as attaching to interior door panel 90 via a press-fit arrangement. Alternatively, other attachment means could be used such as glue, screws, etc. Also, the arm portion 76 has been shown and described as being integrally formed with the housing member 24. It should be appreciated that the arm portion 76 could be made from an elastomeric material in the form of a grommet with a through bore similarly as described above. In such an arrangement, the arm 76 could be integrally formed as part of the seal member 68 so that the seal 68 and the arm/grommet portion 76 would be all one piece with the arm portion extending from the housing 24. Such improvements, changes and modifications within the skill of the art are intended to be covered by the appended claims.

Having described the invention, the following is claimed:
1. A crash pressure sensor comprising:
   a housing;
   an inlet arm extending from the housing, said inlet arm having a through bore;
   a securing means for securing said housing to a dividing panel so that a main portion of the housing is located on a first side of the dividing panel and the inlet arm extends through to a second side of the dividing panel;
   a pressure sensor located in said housing so as to be on the first side of the dividing panel, said pressure sensor sensing air pressure on the second side of the dividing panel via said through bore of said inlet arm and providing an electrical signal indicative of the sensed pressure;

an electrical connector for providing an electrical connection to said pressure sensor within said housing; and a mounting substrate, said pressure sensor secured to said mounting substrate, said electrical connector including connector pins integrally formed with said substrate;

wherein said crash pressure sensor further includes a watertight sealing member surrounding said pressure sensor and at least a portion of said mounting substrate to form a watertight seal around said pressure sensor while allowing fluid communications between said pressure sensor and said through bore of said inlet arm.

2. The crash pressure sensor of claim 1 wherein said through bore of said inlet arm is sloped so as to direct water away from said pressure sensor.

3. The crash pressure sensor of claim 1
wherein a distal end of said inlet arm on the second side of the dividing panel is non-orthogonally angled relative to a center axis of the inlet arm so as to aid in water runoff away from said through bore.

4. A crash pressure sensor comprising:
a housing having a receiving portion and an inlet arm extending from the housing, said inlet arm having a through bore extending from a distal end of the inlet arm to the receiving portion;

a securing means for securing said housing to a dividing panel so that the receiving portion of said housing is located on a first side of the dividing panel and the inlet arm extends through to a second side of the dividing panel;

a base sensor unit dimensioned to be received in said receiving portion of said housing;

a pressure sensor located in said base sensor unit for sensing air pressure on the second side of the dividing panel via said through bore of said inlet arm and providing an electrical signal indicative of the sensed pressure; and said base sensor unit including an electrical connector for providing an electrical connection to said pressure sensor.

5. The crash pressure sensor of claim 4 wherein said securing means is a groove located on said housing, said housing being press fit into a commensurate opening in the dividing panel and held to the dividing panel by the groove.

6. The crash pressure sensor of claim 4 wherein said through bore of said inlet arm is sloped so as to direct water away from said pressure sensor.

7. The crash pressure sensor of claim 4 wherein said base sensor unit further includes a mounting substrate, said pressure sensor secured to said mounting substrate, said electrical connector including connector pins integrally formed with said substrate.

8. The crash pressure sensor of claim 7 wherein said base sensor unit further includes a water tight sealing member surrounding said pressure sensor and at least a portion of said mounting substrate to form a watertight seal between said base sensor unit and said receiving portion of said housing while allowing fluid communications between said sensor unit and said through bore of said inlet arm.

9. The crash pressure sensor of claim 4 wherein the distal end of said inlet arm on the second side of the dividing panel is sloped to aid in water runoff away from an opening of said through bore.

10. The crash pressure sensor of claim 4 wherein said base sensor unit includes releasable locking tabs to releasably hold said base sensor unit to said housing.

11. The crash pressure sensor of claim 4 wherein said connector includes a key to ensure proper direction of any device plugged into said connector.

* * * * *